United States Patent
Lee et al.

(10) Patent No.: US 8,471,599 B2
(45) Date of Patent: Jun. 25, 2013

(54) ADJUSTABLE VOLTAGE COMPARING CIRCUIT AND ADJUSTABLE VOLTAGE EXAMINING DEVICE

(75) Inventors: Yang-Han Lee, Taoyuan County (TW); Yung-Yu Wu, New Taipei (TW)

(73) Assignee: Princeton Technology Corporation, Xindian Dist., New Taipei (TW)

( * ) Notice: Subject to any disclaimer, the term of this patent is extended or adjusted under 35 U.S.C. 154(b) by 164 days.

(21) Appl. No.: 13/114,061

(22) Filed: May 24, 2011

(65) Prior Publication Data

US 2012/0126856 A1    May 24, 2012

(30) Foreign Application Priority Data

May 24, 2010    (TW) ................ 99116485 A

(51) Int. Cl.
   *H03K 5/153*    (2006.01)
(52) U.S. Cl.
   USPC .............. 327/74; 327/75; 327/76; 324/765; 714/716
(58) Field of Classification Search
   USPC ............ 327/74–76; 324/765; 714/716
   See application file for complete search history.

(56) References Cited

U.S. PATENT DOCUMENTS

| | | | | |
|---|---|---|---|---|
| 5,066,909 A | * | 11/1991 | Firooz | 324/750.01 |
| 5,835,506 A | * | 11/1998 | Kuglin | 714/738 |
| 7,363,568 B2 | * | 4/2008 | Guidry | 714/745 |
| 7,388,410 B2 | * | 6/2008 | Kim et al. | 327/108 |
| 2006/0010360 A1 | * | 1/2006 | Kojima | 714/738 |

* cited by examiner

*Primary Examiner* — Kenneth B. Wells
(74) *Attorney, Agent, or Firm* — Winston Hsu; Scott Margo

(57) ABSTRACT

In an adjustable voltage examining module, while a logic tester issues an input signal to an audio module under test, upper/low-threshold reference signals are simultaneously issued to an adjustable voltage comparing circuit. While the adjustable voltage comparing circuit receives a signal under test returned by the to-be-examined audio module after a while, the adjustable voltage comparing circuit loads both an high-threshold reference voltage and a low-threshold reference voltage respectively indicated by the reference upper/low-threshold signal so as to compare both the upper and low-threshold reference voltages with the signal under test. Therefore, while the signal under test is examined to acquire a voltage level between voltage levels of the upper and low-threshold reference signals, precise operations of the audio module under test are assured, and time wasted by continuously-issued interrupt is saved.

8 Claims, 7 Drawing Sheets

ADJUSTABLE VOLTAGE COMPARING CIRCUIT AND ADJUSTABLE VOLTAGE EXAMINING DEVICE

CROSS-REFERENCE TO RELATED APPLICATION

This application claims the benefit of priority of Taiwan Patent Application No. 099116485, filed May 24, 2010, included herein by reference for all intents and purposes.

BACKGROUND OF THE INVENTION

1. Field of the Invention

The present invention discloses an adjustable voltage comparing circuit and an adjustable voltage examining device, and more particularly, an adjustable voltage comparing circuit and an adjustable voltage examining device for confirming whether an audio signal under test is normal or not by examining whether a voltage level of the audio signal under test is between an high-threshold reference voltage and a low-threshold reference voltage or not.

2. Description of the Prior Art

Please refer to FIG. 1, which illustrates a conventional audio testing module 100. As shown in FIG. 1, the audio testing module 100 includes a logic tester 110 and a device under test 120. The logic tester 110 is used for issuing an input signal for testing, and for examining whether the device under test 120 is precisely operated or not according to a signal under test returned by the device under test 120.

The logic tester 110 may examine the device under test by two means. In a first means, a function generator of the logic tester 110 generates an input signal required by integrated circuits of the device under test 120; after a corresponding output signal, i.e., a signal under test, is generated from the device under test 120, a precision measurement unit of the logic tester 110 retrieves a measure value by measurements and calculations so as to examine whether the device under test 120 is precisely operated or not. However, during the examining procedure of the logic tester, interrupts have to be continuously issued for transferring tokens between the function generator and the precision measurement unit, so as to repeatedly set and generate different input signals; as a result, the testing procedure of the logic tester 110 cannot be synchronous, and a large amount of testing time and capitals is also wasted by the continuously-issued interrupts.

In a second means, just the function generator of the logic tester 110 is used for performing outputting and comparison related to the input signal and the signal under test, where there are comparators in the function generator for performing the required comparisons. Since the device under test 120 is able to use different gains for generating voltages of different voltage level ranges, different upper/low-threshold voltages have to be set for the generated voltages of different voltage level ranges; in other words, during the examination of the logic tester 110, the low/high-threshold voltages have to be repeatedly reset and loaded into comparators of the function generator for being compared with the signal under test, and large amounts of testing time is also wasted during the repeatedly reset operations and loadings.

SUMMARY OF THE INVENTION

The claimed invention discloses an adjustable voltage comparing circuit. The adjustable voltage comparing circuit comprises a high-threshold reference module, a low-threshold reference module, and a comparing module. The high-threshold reference module is used for receiving a high-threshold reference signal transmitted by a logic tester, and for generating a corresponding high-threshold reference voltage according to the high-threshold reference signal. The low-threshold reference module is used for receiving a low-threshold reference signal transmitted from the logic tester, and for generating a corresponding low-threshold reference voltage according to the low-threshold reference signal. The comparing module is coupled between the high-threshold reference module and the low-threshold reference module, for examining whether a voltage level of a signal under test is between voltage levels of the high-threshold reference voltage and the low-threshold reference voltage or not.

The claimed invention discloses an adjustable voltage examining device. The adjustable voltage examining device comprises a logic tester and an adjustable voltage comparing circuit. The logic tester is used for providing an input signal to a device under test, for examining the device under test. The adjustable voltage comparing circuit is coupled between the logic tester and the device under test, for receiving a high-threshold reference signal and a low-threshold reference signal, both of which are transmitted from the logic tester, and for receiving a signal under test transmitted from the device under test. The adjustable voltage comparing circuit comprises a high-threshold reference module, a low-threshold reference module, and a comparing module. The high-threshold reference module is used for receiving the high-threshold reference signal transmitted from the logic tester, and for generating a corresponding high-threshold reference voltage according to the high-threshold reference signal. The low-threshold reference module is used for receiving the low-threshold reference signal transmitted from the logic tester, and for generating a corresponding low-threshold reference voltage according to the low-threshold reference signal. The comparing module is coupled between the high-threshold reference module and the low-threshold reference module, for examining whether a voltage level of the signal under test is between levels of the high-threshold reference voltage and the low-threshold reference voltage.

These and other objectives of the present invention will no doubt become obvious to those of ordinary skill in the art after reading the following detailed description of the preferred embodiment that is illustrated in the various figures and drawings.

DETAILED DESCRIPTION

Figure 2:
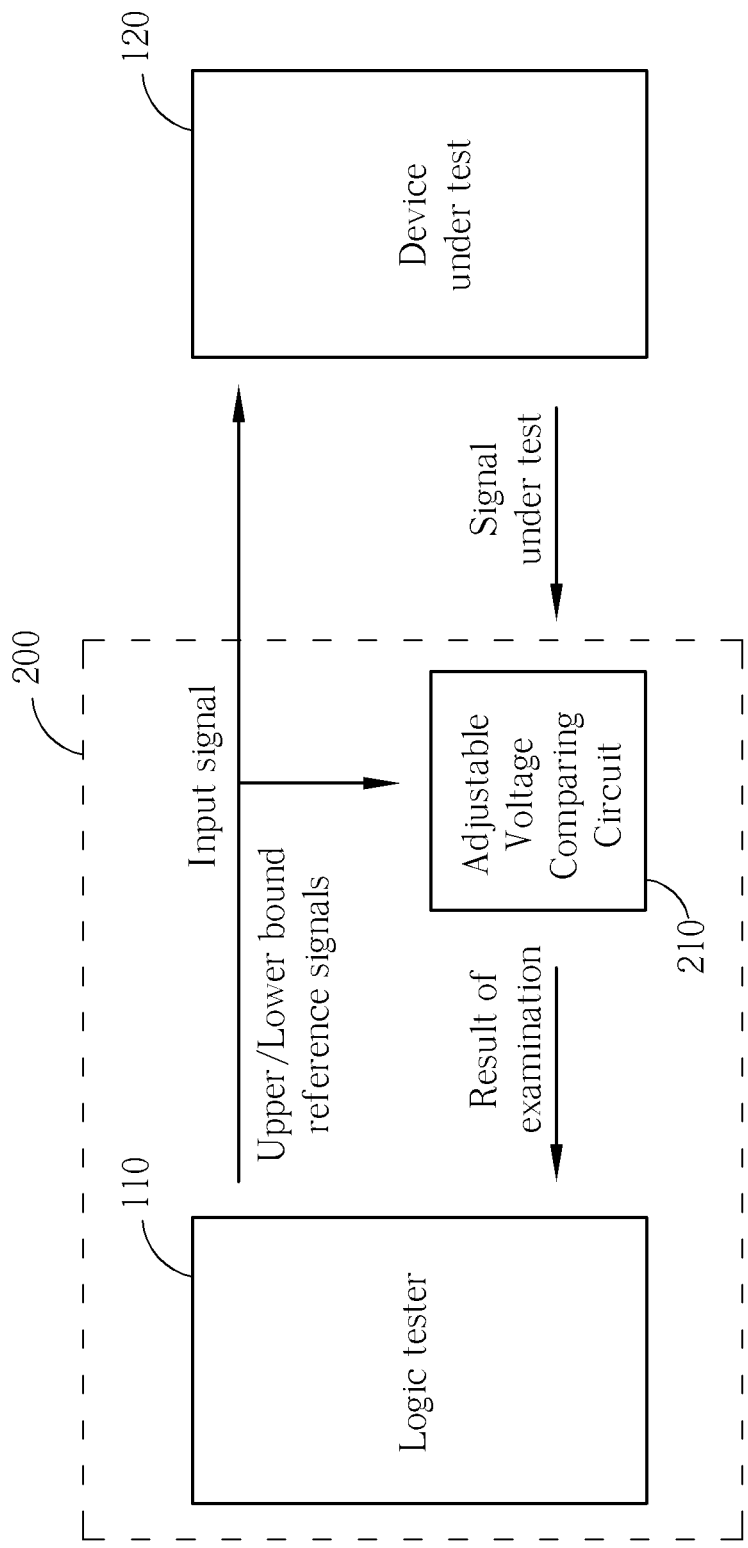
FIG. 2 schematically illustrates an adjustable voltage examining device of the present invention.

Please refer to FIG. 2, which schematically illustrates an adjustable voltage examining device 200 of the present invention. As shown in FIG. 2, the adjustable voltage examining device 200 includes the logic tester 110 and an adjustable voltage comparing circuit 210. While testing the device under test 120, the logic tester 110 issues an input signal to the device under test 120, so that the device under test 120 is capable of generating a signal under test corresponding to the input signal and of outputting the signal under test to the adjustable voltage comparing circuit 210, and the device under test 120 may thus be examined according to the signal under test. Besides, the logic tester 110 issues a high-threshold reference signal and a low-threshold reference signal to the adjustable voltage comparing circuit 210, according to contents indicated by a voltage level of the input signal. Therefore, the adjustable voltage comparing circuit 210 is capable of generating corresponding high/low-threshold voltages according to the high-threshold reference signal and the low-threshold reference signal, and is thereby capable of examining the signal under test so as to confirm whether the device under test is precisely operated.

Figure 3:
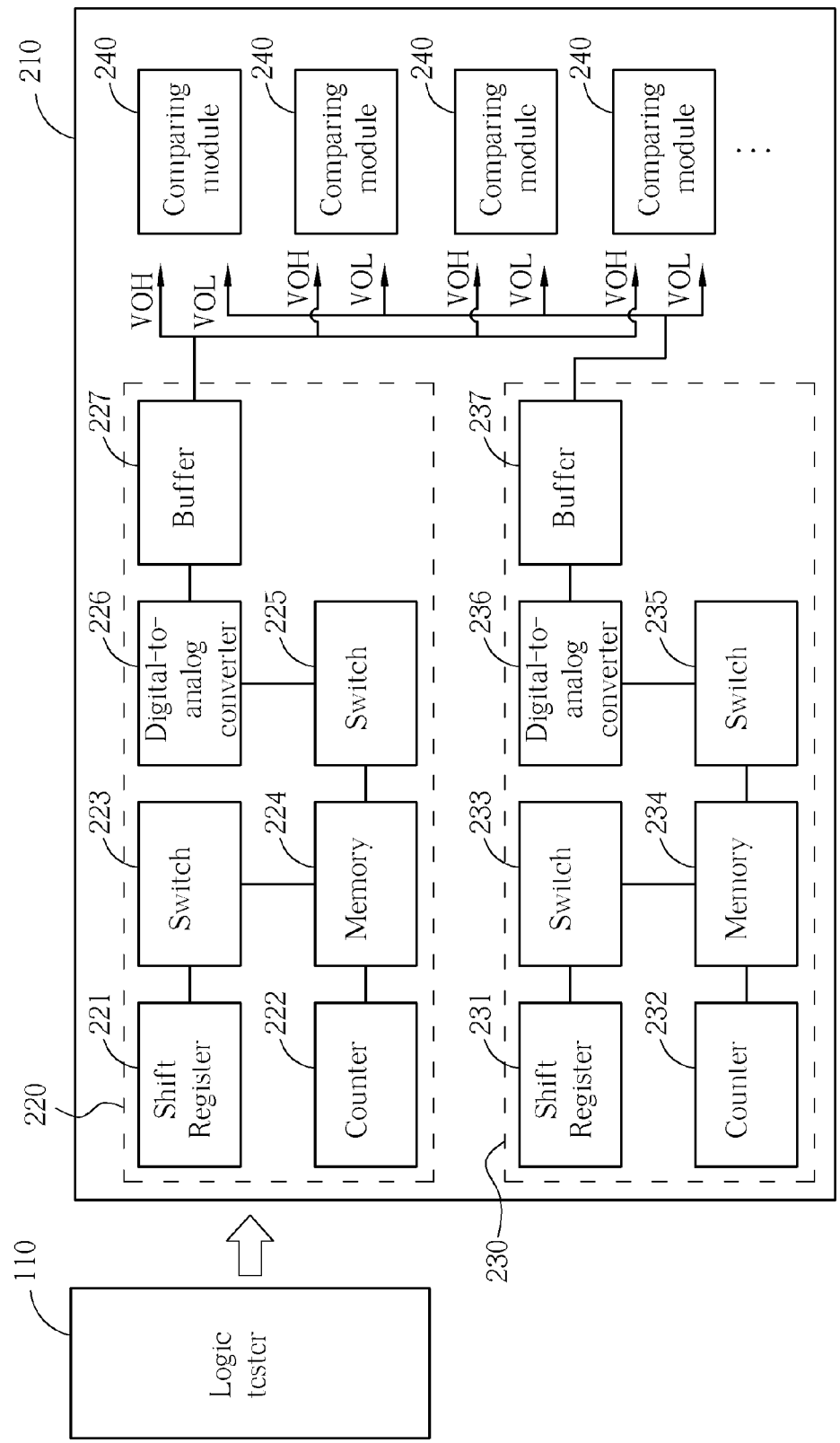
FIGS. 3-5 illustrate the adjustable voltage comparing circuit shown in FIG. 2 in detail.

Please refer to FIG. 3, which illustrates the adjustable voltage comparing circuit 210 shown in FIG. 2 in detail. As shown in FIG. 3, the adjustable voltage comparing circuit 210 includes a high-threshold reference module 220, a low-threshold reference module 230, and at least one comparing module 240. The high-threshold reference module 220 is used for generating a high-threshold reference voltage VOH according to the high-threshold reference signal, and the lower reference module 230 is used for generating a low-threshold reference voltage VOL according to the low-threshold reference signal, where a voltage level of the high-threshold reference voltage VOH is higher than a voltage level of the low-threshold reference voltage VOL. The comparing module 240 compares the high-threshold reference voltage VOH and the low-threshold reference voltage VOL with the signal under test, and confirms whether a voltage level of the signal under test is correct or not according to whether the voltage level of the signal under test is between voltage levels of the high-threshold reference voltage VOH and the low-threshold reference voltage VOL. As a result, whether the device under test 120 is precisely operated or not can thus be confirmed.

The high-threshold reference module 220 includes a shift register 221, a counter 222, switches 223 and 225, a memory 224, a digital-to-analog converter 226, and a buffer 227. The low-threshold reference module 230 includes a shift register 231, a counter 232, switches 233 and 235, a memory 234, a digital-to-analog converter 236, and a buffer 237.

Figure 4:
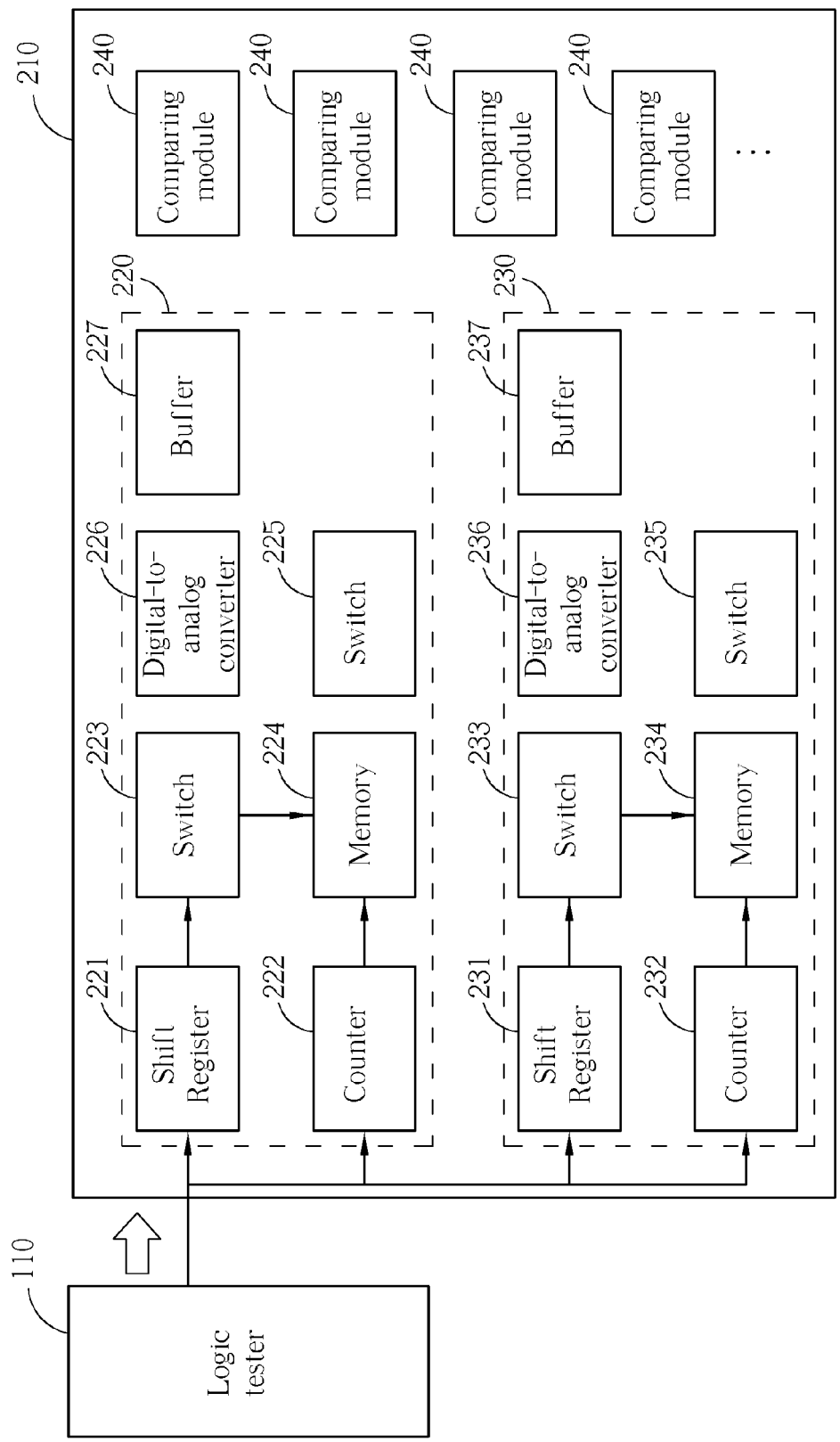

As shown in FIG. 4, for cooperating with a storage format of the memory 224, the high-threshold reference signal, which essentially indicates a consecutive bit string, has to be transformed into a discrete parallel storage form for enhance succeeding loadings of the high-threshold reference signal, i.e., the high-threshold reference signal has to be performed with a serial-to-parallel data transformation. Therefore, the shift register 221 and the switch 223 cooperate for performing the serial-to-parallel data transformation on the high-threshold reference signal and for buffering the high-threshold reference signal in the memory 224. Note that during the serial-to-parallel data transformation is performed on the high-threshold reference signal, counting of the counter 222 is required for recording a buffering address of the high-threshold reference signal on the memory 224. Similarly, the low-threshold reference signal is also buffered on a buffering address of the memory 234 by cooperation of the shift register 231, the switch 233, and the counter 232.

Figure 5:
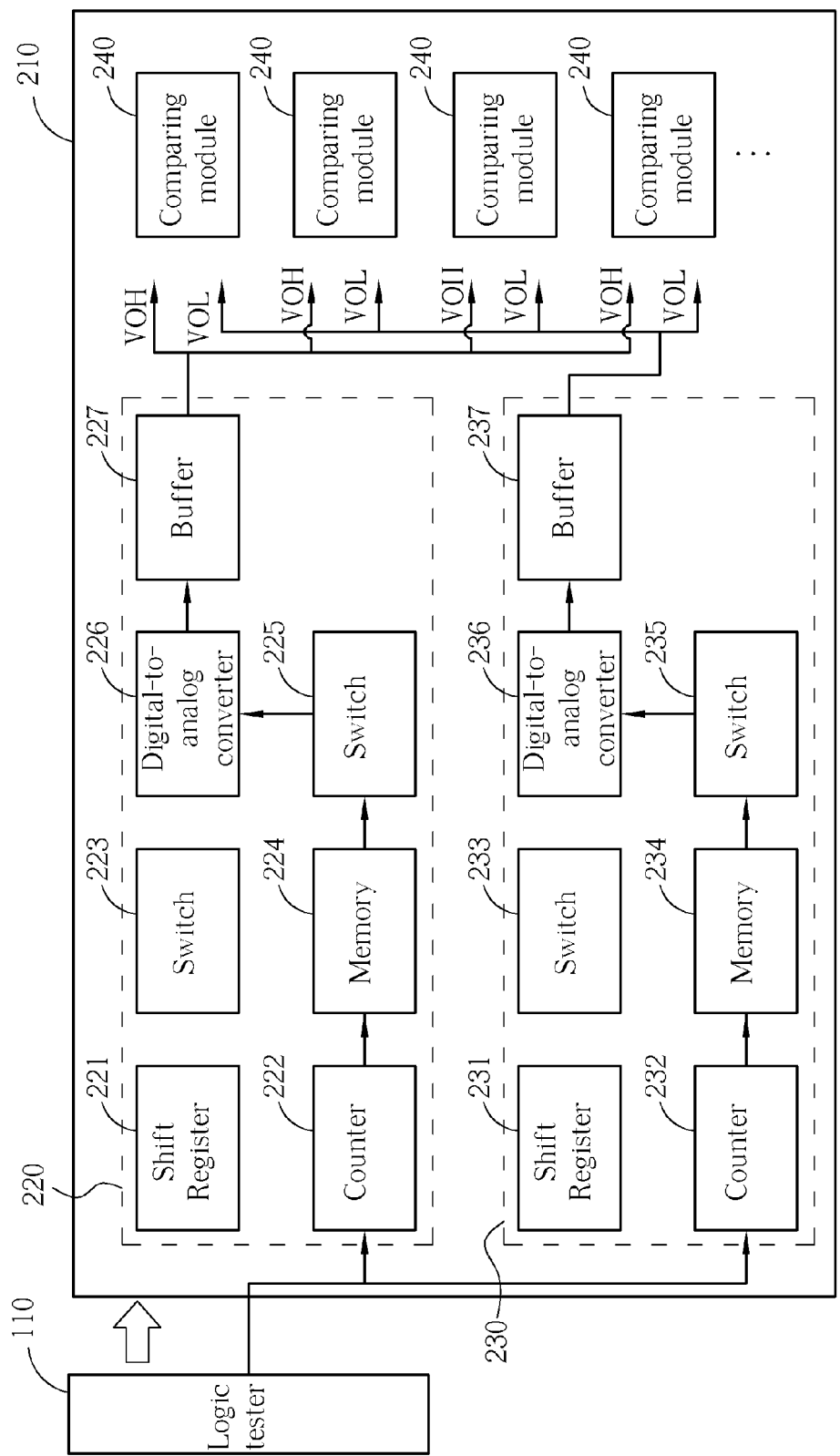

As shown in FIG. 5, after the adjustable voltage comparing circuit 210 receives the signal under test, the adjustable voltage comparing circuit 210 loads values of the high-threshold reference signal and the low-threshold reference signal respectively from the memory 224 and the memory 234 and into a single comparing module 240. The high-threshold reference module 220 finds the buffering address for buffering the high-threshold reference signal on the memory 224 according to counting of the counter 222, and thereby loads the value of the high-threshold reference signal, which indicates a voltage level, and outputs the loaded value to the digital-to-analog converter 226. Then the digital-to-analog converter 226 transforms the value of high-threshold reference signal into an analog high-threshold reference voltage VOH, and outputs the high-threshold reference voltage VOH to the buffer 227, which is used for storing analog voltages and is specifically designed for driving a plurality of comparing modules 240. Therefore, with the aid of the buffer 227, an amount of used comparing modules 240 can be dynamically adjusted according to practical requirements. Similarly, operations of the low-threshold reference module 230 are similar with those of the high-threshold reference module 220, a low-threshold reference voltage VOL, which is transformed in a digital-to-analog manner, is also loaded into a same single comparing module 240 under cooperation of the memory 234, the switch 235, the digital-to-analog converter 236, and the buffer 237.

Figure 6:
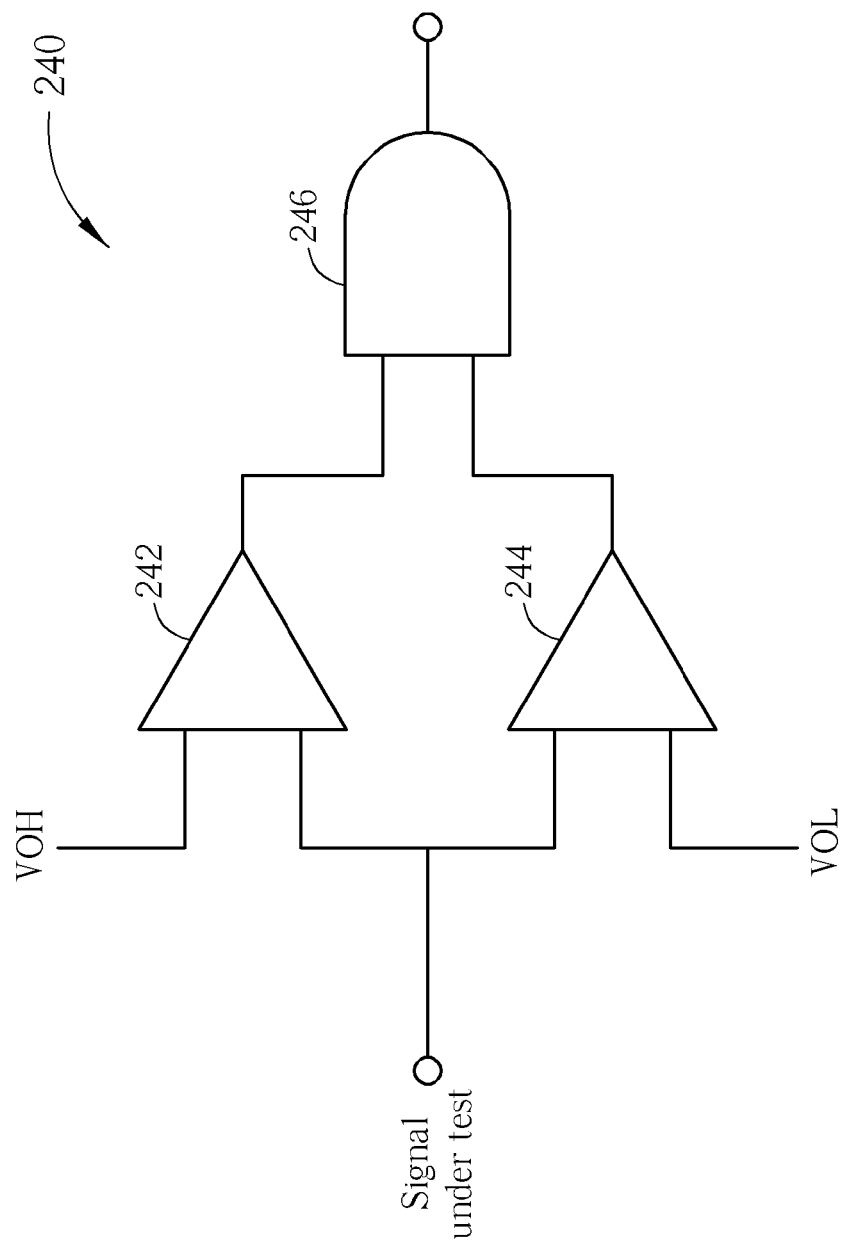
FIG. 6 illustrates the comparing module shown in FIG. 3 in detail.

Please refer to FIG. 6, which illustrates the comparing module 240 shown in FIG. 3 in detail. As shown in FIG. 6, the comparing module 240 includes comparators 242 and 244, and an AND gate 246. The comparator 242 has a positive input terminal for receiving the high-threshold reference voltage VOH from the voltage reference module 220, and has a negative input terminal for receiving the signal under test from the device under test 120. The comparator 244 has a positive input terminal for receiving the signal under test from the device under test 120, and has a negative input terminal for receiving the low-threshold reference voltage VOL from the voltage reference module 230. The AND gate has a first input terminal coupled to an output terminal of the comparator 242, and has a second input terminal coupled to an output terminal of the comparator 244.

When the comparing module 240 receives the signal under test, the signal under test is compared with the high-threshold reference voltage VOH by the comparator 242; when a voltage level of the signal under test is lower than a voltage level of the high-threshold reference voltage VOH, the comparator 242 outputs a first output signal having a high voltage level to the AND gate 246. Similarly, the signal under test is also compared with the low-threshold reference voltage VOL by the comparator 244; when the voltage level of the signal under test is higher than the low-threshold reference voltage VOL, the comparator 244 also outputs a second output signal having a high voltage level to the AND gate 246. While the AND gate 246 receives both the first and second output signals having high voltage levels at the same time, a third output signal having a high voltage level is outputted for indicating that a current voltage level of the signal under test is between the voltage levels of the high-threshold reference voltage VOL and the low-threshold reference voltage VOL, i.e., i.e., the device under test 120 is precisely operated. Otherwise, while at least one of the comparators 242 and 244 outputs an output signal having a low voltage level, it indicates that the voltage level of the signal under test is higher than the voltage level of the high-threshold reference voltage VOH or lower than the voltage level of the low-threshold reference voltage VOL, and the AND gate 246 outputs an output signal having a low voltage level for indicating that the device under test 120 is not precisely operated.

For having the adjustable voltage examining device 200 be capable of examining a plurality of devices under test 120 simultaneously, the adjustable voltage comparing circuit 210 is configured to be capable of driving more than one comparing module 240 with the aid of a single buffer, where each of the comparing modules 240 is respectively coupled to a single device under test 120, so as to receive a single signal under test for performing the abovementioned comparisons and examinations. For example, the buffers 237 and 238 shown in FIG. 5 are respectively configured to drive a plurality of comparing modules 240.

Figure 1:
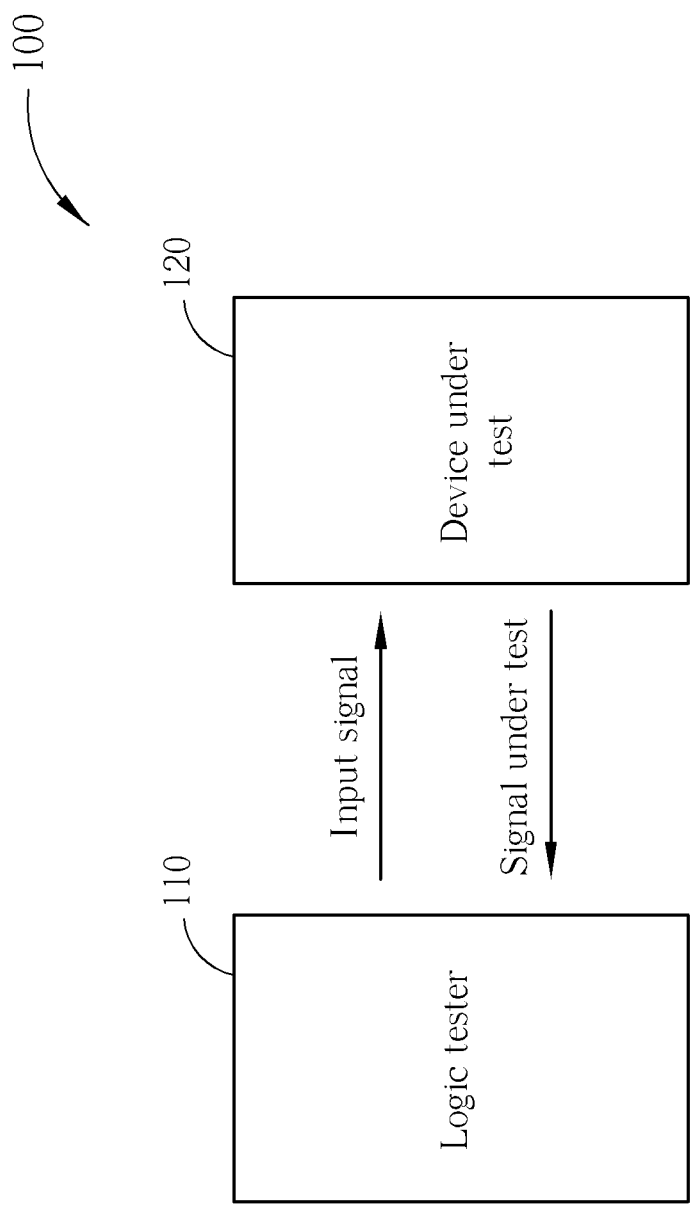
FIG. 1 illustrates a conventional audio testing module.
Figure 7:
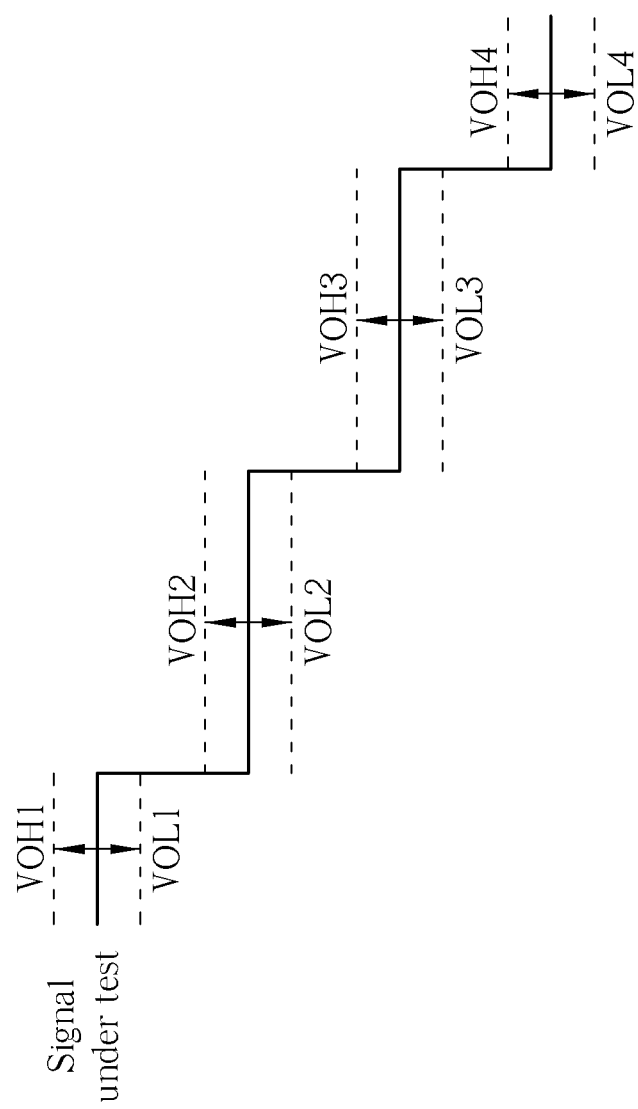
FIG. 7 illustrates different voltage level ranges of a high-threshold reference voltage and a low-threshold reference voltage, both of which are dynamically set for different voltage levels indicated by the signal under test, while the adjustable voltage examining device examines a single device under test.

Please refer to FIG. 7, which illustrates different voltage level ranges of the high-threshold reference voltage VOH and the low-threshold reference voltage VOL, both of which are dynamically set for different voltage levels indicated by the signal under test, while the adjustable voltage examining device 200 examines a single device under test 120, where the voltage levels VOH1, VOH2, VOH3, and VOH4 indicate different voltage levels indicated by the high-threshold reference signal, and the voltage levels VOL1, VOL2, VOL3, and VOL4 indicate different voltage levels indicated by the low-threshold reference signal. As shown in FIG. 7, while the adjustable voltage examining device 200 receives signals under test of different voltage level ranges, with the aid of the adjustable comparing circuit 210 shown in FIG. 3, the high-threshold reference signal for indicating the high-threshold reference voltage VOH and the low-threshold reference signal for indicating the low-threshold reference voltage VOL are respectively and dynamically loaded from the memory 224 and the memory 234 with different voltage level ranges, i.e., the voltages VOH1-VOH4 and VOL1-VOL4. Therefore, interrupts, which are used as shown in FIG. 1, are not required for continuously adjusting the high-threshold reference voltage and the low-threshold reference voltage, and time wasted by switching tokens are thus saved.

Besides, under the examination, the procedure of loading contents of both the high-threshold reference signal and the low-threshold reference signal into the memory 224 and 234 as shown in FIG. 4, may be implemented merely once; and after a while, as shown in FIG. 5, different voltage levels indicated by both the loaded high-threshold reference signal and low-threshold reference signal are loaded from different buffering addresses on the memory 224 and 234 for continuous examination.

The present invention discloses an adjustable voltage comparing circuit and an adjustable voltage examining device applying the adjustable voltage comparing circuit. At the same time when the logic tester issues an input signal to the device under test, the logic tester also issues both a high-threshold reference signal and a low-threshold reference signal to the adjustable voltage comparing circuit disclosed in the present invention; and after the adjustable voltage comparing circuit receives a signal under test returned by the device under test, both a high-threshold reference voltage indicated by the high-threshold reference signal and a low-threshold reference voltage indicated by the low-threshold reference signal are compared with a voltage level of the signal under test. Therefore, while the voltage level of the signal under test is confirmed to be between voltage levels of both the upper/low-threshold reference voltages, the device under test is also assured of its precise operation, and large amount of time wasted by interrupts is thus saved.

Those skilled in the art will readily observe that numerous modifications and alterations of the device and method may be made while retaining the teachings of the invention.

What is claimed is:

1. An adjustable voltage comparing circuit, comprising:
a high-threshold reference module, comprising:
a first memory, used for buffering a high-threshold reference signal transmitted by a logic tester;
a first digital-to-analog converter, used for generating the high-threshold reference voltage according to a voltage level indicated by the high-threshold reference signal;
a first shift register;
a first counter; and
a first switch;
wherein the first shift register is used to the high-threshold reference signal in performance of serial-to-parallel data transformation through the first switch and buffer of the high-threshold reference signal in the first memory, and the first counter is used for counting so as to record a buffering address of the buffered high-threshold reference signal on the first memory;
a low-threshold reference module, comprising:
a second memory, used for buffering a low-threshold reference signal transmitted from the logic tester;
a second digital-to-analog converter, used for generating the low-threshold reference voltage according to a voltage level indicated by the low-threshold reference signal;
a second shift register;
a second counter; and
a second switch;
wherein the second shift register is used to the low-threshold reference signal in performance of serial-to-parallel data transformation through the second switch and buffer of the low-threshold reference signal in the second memory, and the second counter is used for counting so as to record a buffering address of the buffered low-threshold reference signal on the second memory; and
a comparing module coupled between the high-threshold reference module and the low-threshold reference module for determining whether a voltage level of a signal under test is between voltage levels of the high-threshold reference voltage and the low-threshold reference voltage.

2. The adjustable voltage comparing circuit of claim 1, wherein the high-threshold reference module further comprises:
a third switch for obtaining the high-threshold reference signal from the first memory according to a counting of the first counter and for transmitting the high-threshold reference signal to the first digital-to-analog converter; and
a first buffer for obtaining the high-threshold reference voltage from the first digital-to-analog converter and for buffering the high-threshold reference voltage;
wherein the low-threshold reference module further comprises:
a fourth switch for obtaining the low-threshold reference signal from the second memory according to a counting of the second counter, and for transmitting the low-threshold reference signal to the second digital-to-analog converter; and
a second buffer for obtaining the low-threshold reference voltage from the second digital-to-analog converter and for buffering the low-threshold reference voltage.

3. The adjustable voltage comparing circuit of claim 1, wherein the comparing module comprises:
a first comparator having a positive input terminal for receiving the high-threshold reference voltage from the high-threshold reference module, and having a negative input terminal for receiving the signal under test;

a second comparator having a positive input terminal for receiving the signal under test, and having a negative input terminal for receiving the low-threshold reference voltage from the low-threshold reference module; and an AND gate having a first input terminal coupled to an output terminal of the first comparator, and having a second input terminal coupled to an output terminal of the second comparator.

4. The adjustable voltage comparing circuit of claim 1, wherein voltage levels indicated by the high-threshold reference signal and the low-threshold reference signal are calculated according to a given input voltage, a given gain, a given offset, and a given reference voltage;

wherein the voltage level indicated by the high-threshold reference signal is calculated as follows:

$$VOH = 10^{\left(\frac{Gain+R}{20}\right)} * (VIN - VREF) + VREF;$$

wherein the voltage level indicated by the low-threshold reference signal is calculated as follows:

$$VOL = 10^{\left(\frac{Gain-R}{20}\right)} * (VIN - VREF) + VREF;\text{ and}$$

wherein VOH indicates the voltage level indicated by the high-threshold reference signal, VOL indicates the voltage level indicated by the low-threshold reference signal, Gaun indicates the given gain, R indicates the given offset, VREF indicates the given reference voltage, and VIN indicates the given input voltage.

5. An adjustable voltage examining device, comprising:
a logic tester, for providing an input signal to a device under test, for examining the device under test; and
an adjustable voltage comparing circuit, coupled between the logic tester and the device under test, for receiving a high-threshold reference signal and a low-threshold reference signal, both of which are transmitted from the logic tester, and for receiving a signal under test transmitted from the device under test, the adjustable voltage comparing circuit comprising:
    a high-threshold reference module, comprising:
        a first memory, used for buffering the high-threshold reference signal;
        a first digital-to-analog converter, used for generating the high-threshold reference voltage according to a voltage level indicated by the high-threshold reference signal;
        a first shift register;
        a first counter; and
        a first switch;
        wherein the first shift register is used for cooperating with the first switch, so as to perform serial-to-parallel data transformation on the high-threshold reference signal and to buffer the high-threshold reference signal in the first memory, and the first counter is used for counting so as to record a buffering address of the high-threshold reference signal on the first memory;
    a low-threshold reference module, comprising:
        a second memory, used for buffering the low-threshold reference signal;
        a second digital-to-analog converter, used for generating the low-threshold reference voltage according to a voltage level indicated by the low-threshold reference signal;
        a second shift register;
        a second counter; and
        a second switch;
        wherein the second shift register is used for cooperating with the second switch, so as to perform serial-to-parallel data transformation on the low-threshold reference signal and to buffer the low-threshold reference signal in the second memory, and the second counter is used for counting so as to record a buffering address of the low-threshold reference signal on the second memory;
    a comparing module, coupled between the high-threshold reference module and the low-threshold reference module, for examining whether a voltage level of the signal under test is between levels of the high-threshold reference voltage and the low-threshold reference voltage.

6. The adjustable voltage examining device of claim 5, wherein the high-threshold reference module further comprises:
    a third switch, for loading the high-threshold reference signal from the first memory according to a counting of the first counter, and for transmitting the high-threshold reference signal to the first digital-to-analog converter; and
    a first buffer, for loading the high-threshold reference voltage from the first digital-to-analog converter and for buffering the loaded high-threshold reference voltage;
wherein the low-threshold reference module further comprises:
    a fourth switch, for loading the low-threshold reference signal from the second memory according to a counting of the second counter, and for transmitting the low-threshold reference signal to the second digital-to-analog converter; and
    a second buffer, for loading the low-threshold reference voltage from the second digital-to-analog converter and for buffering the loaded low-threshold reference voltage.

7. The adjustable voltage examining device of claim 5, wherein the comparing module comprises:
    a first comparator, having a positive input terminal for receiving the high-threshold reference voltage from the high-threshold reference module, and having a negative input terminal for receiving the signal under test;
    a second comparator, having a positive input terminal for receiving the signal under test, and having a negative input terminal for receiving the low-threshold reference voltage from the low-threshold reference module; and
    an AND gate, having a first input terminal coupled to an output terminal of the first comparator, and having a second input terminal coupled to an output terminal of the second comparator.

8. The adjustable voltage examining device of claim 5, wherein voltage levels indicated by the high-threshold reference signal and the low-threshold reference signal are calculated according to a given input voltage, a given gain, a given offset, and a give reference voltage;
wherein the voltage level indicated by the high-threshold reference signal is calculated as follows:

$$VOH = 10^{\left(\frac{Gain+R}{20}\right)} * (VIN - VREF) + VREF;$$

wherein the voltage level indicated by the low-threshold reference signal is calculated as follows:

$$VOL = 10^{\left(\frac{Gain-R}{20}\right)} * (VIN - VREF) + VREF; \text{ and}$$

wherein VOH indicates the voltage level indicated by the high-threshold reference signal, VOL indicates the voltage level indicated by the low-threshold reference signal, Gaun indicates the given gain, R indicates the given offset, VREF indicates the give reference voltage, and VIN indicates the given input voltage.

* * * * *